United States Patent [19]
Morooka

[11] Patent Number: 5,082,685
[45] Date of Patent: Jan. 21, 1992

[54] METHOD OF CONDUCTING PLASMA TREATMENT

[75] Inventor: Hisao Morooka, Yachiyo, Japan

[73] Assignee: TDK Corporation, Tokyo, Japan

[21] Appl. No.: 554,460

[22] Filed: Jul. 19, 1990

[30] Foreign Application Priority Data

Jul. 24, 1989 [JP] Japan .................................. 1-191181
Nov. 20, 1989 [JP] Japan .................................. 1-301139

[51] Int. Cl.$^5$ .............................................. B05D 3/06
[52] U.S. Cl. ...................................... 427/38; 156/643;
156/646; 427/47; 427/255.1; 427/294; 427/307;
427/444
[58] Field of Search ................ 427/35, 47, 38, 255.1,
427/307, 444, 294; 156/643, 646

[56] References Cited

U.S. PATENT DOCUMENTS 4,740,267 4/1988 Knauer et al. ...................... 427/38 X

FOREIGN PATENT DOCUMENTS

278480A2 8/1988 European Pat. Off. .
326405A2 8/1989 European Pat. Off. .

OTHER PUBLICATIONS

Japanese Patent Abstracts of Japan, 63-83273 A, C.523, Aug. 24, 1988, vol. 12, No. 312.
Japanese Patent Abstracts of Japan, 1-17869 A, C-593, May 8, 1989, vol. 13, No. 190.
Japanese Patent Abstracts of Japan, 1-180981 A, C-646, Oct. 20, 1989, vol. 13, No. 466.

Primary Examiner—Bernard Pianalto
Attorney, Agent, or Firm—Oblon, Spivak, McClelland, Maier & Neustadt

[57] ABSTRACT

A treatment, typically plasma treatment apparatus comprises a plasma creating chamber adapted to create a plasma therein, a treating chamber in communication with the plasma creating chamber through an electrode for drawing electron beams from the plasma, an input conduit coupled to the treating chamber for introducing a reaction gas therein, and directive means associated with the input conduit for imparting directivity to the reaction gas. With the apparatus, plasma treatment, typically plasma CVD or plasma etching is carried out on an article in the chamber by forming a high density region of the reaction gas substantially perpendicular to the electron beams in the chamber.

21 Claims, 5 Drawing Sheets

METHOD OF CONDUCTING PLASMA TREATMENT

This invention relates to a method and apparatus for vacuum treatments, typically plasma treatments such as plasma CVD and plasma etching.

BACKGROUND OF THE INVENTION

Plasma chemical vapor deposition (CVD) is often used in the manufacture of diamond thin films and amorphous silicon thin films. Also for the formation of fine patterns required in the manufacture of semiconductor elements, plasma etching is useful. Various plasma creating sources are used for plasma treatments including plasma CVD and plasma etching. Typical plasma sources are plasma creating means utilizing electron cyclotron resonance (ECR) as disclosed in Japanese Patent Application Kokai No. 65843/1989 and plasma creating means utilizing radio frequency induction heating. Among others, plasma creating means of the ECR type are of greater interest because higher electron densities and increased throughput speeds are available.

The ECR plasma creating means is designed such that electrons are accelerated resonantly by the interaction between an electric field and a magnetic field whereby impingement of accelerated electrons converts the gas into a plasma. It is also known to extract desired ions from the plasma by means of a control electrode, typically an ion accelerator electrode (see Japanese Patent Application Kokai No. 103099/1985).

Plasma CVD involves the step of depositing ions and radicals from a plasma on a substrate to form a film thereon. It is also possible to form a film by extracting electrons from a plasma, causing the electrons to impinge against a feed gas to convert the gas into a plasma, and depositing ions and radicals in the plasma on a substrate as disclosed in Japanese Patent Application Kokai No. 65843/1989.

Plasma etching is to etch an object (substrate or workpiece) by causing ions and radicals in a plasma to impinge against the object.

In the plasma creating means utilizing ECR, an operating pressure of approximately $10^{-4}$ Torr is generally maintained in order to establish appropriate mean free paths of electrons and ions in a plasma. The operating pressure of this order imposes a certain limit on the throughput speed in either of plasm CVD and plasma etching. Other plasma creating means based on radio frequency induction heating or the like utilize higher operating pressures than in the ECR plasma, but result in rather lower throughput speeds because the electron density and temperature are lower so that ions and radicals are produced in a lower density.

For plasma treatment, it is required that only selected ones of electrons, ions, and radicals be available on a substrate to be treated. In the case of plasma CVD, for example, unnecessary electrons and ions can cause damage to the substrate and leave defects in the resulting film. Also, undesirable reaction can take place on the film surface, restraining desirable reaction of radicals or ions with a lowering of film formation rate. Further, active species generated in the plasma creating chamber would produce various dissociated ions because electrons have a broad energy distribution. Then, an attempt to extract such active species into the treating chamber by means of a accelerator electrode will fail to form a desired film of quality since unnecessary or reaction inhibiting ions are extracted at the same time.

SUMMARY OF THE INVENTION

Therefore, an object of the present invention is to provide a method for conducting vacuum treatment, typically plasma treatment on an article at an increased throughput speed while preventing damage to the article and occurrence of undesirable reaction on the article surface. Another object of the present invention is to provide a vacuum treating, typically plasma treating apparatus for implementing the vacuum or plasma treatment.

Broadly stated, in combination with a vacuum treating apparatus comprising a generator chamber having means for generating a high density of electrons therein, a treating chamber in communication with the generator chamber through an electron accelerator electrode, and input means for introducing a reaction gas in the treating chamber, the electron accelerator electrode serving to draw a flow of electrons from the generator chamber into the treating chamber, a method for conducting vacuum treatment according to the invention includes the step of forming a high density region of the reaction gas substantially perpendicular to the electron flow in the treating chamber.

An apparatus for vacuum treatment comprises a generator chamber having means for generating a high density of electrons therein, a treating chamber in communication with the generator chamber through an electron accelerator electrode, input means for introducing a reaction gas in the treating chamber, and directive means between the treating chamber and the input means for imparting directivity to the reaction gas. The generator chamber serves to generate electrons in a high density, the activating chamber serves to convert reaction gas molecules into active species, and the treating chamber serves to allow the active species to deposit or interact on an article for deposition or treatment. The essential requirement is to generate active species from a reaction gas although it is often preferred to generate a particle plasma.

In a preferred form of the invention, in combination with a plasma treating apparatus comprising a plasma creating chamber having means for creating a plasma therein, a treating chamber coupled to the plasma creating chamber through an electron accelerator electrode, and input means for introducing a reaction gas in the treating chamber, the electron accelerator electrode serving to draw a flow of electrons from the plasma into the treating chamber, there is provided a method for conducting plasma treatment, comprising the step of forming a high density region of the reaction gas substantially perpendicular to the electron flow in the treating chamber.

According to another aspect of the invention, there is provided an apparatus for plasma treatment, comprising a plasma creating chamber having means for creating a plasma therein; a treating chamber coupled to the plasma creating chamber through an electron accelerator electrode; input means for introducing a reaction gas in the treating chamber; and directive means between the treating chamber and the input means for imparting directivity to the reaction gas.

In another form, a plasma treating apparatus comprises a plasma creating chamber having means for creating a plasma therein; an electron accelerator electrode for drawing electron beams from the plasma; a chamber having a magnet disposed about its periphery for radially diverging the electron beams; a collimating electrode for collimating the divergent electron beams into substantially parallel electron beams; a plasma reaction chamber; input means for introducing a reaction gas in the plasma reaction chamber, the reaction gas being activated by the collimated electron beams in the plasma reaction chamber; and a plasma treating chamber in communication with the plasma reaction chamber for conducting plasma treatment on an article with the electron beams; and directive means between the input means and the plasma reaction chamber for imparting directivity to the reaction gas.

In a further form, a plasma treating apparatus comprises a plasma creating chamber having means for creating a plasma therein; an electron accelerator electrode for drawing electron beams from the plasma; a plasma reaction chamber; input means for introducing a reaction gas in the plasma reaction chamber, the reaction gas being activated by the electron beams in the plasma reaction chamber; an ion accelerator electrode for drawing ion beams from the plasma reaction chamber; a chamber having a magnet disposed about its periphery for radially diverging the ion beams; a collimating electrode for collimating the divergent ion beams into substantially parallel ion beams; a plasma treating chamber for conducting plasma treatment on an object with the collimated ion beams; and directive means between the input means and the plasma reaction chamber for imparting directivity to the reaction gas.

In preferred embodiments, the plasma creating means is of the electron cyclotron resonance type. An ion accelerator electrode and/or an ion blocking electrode may be provided in the treating chamber. A high vacuum exhaust port may be disposed in the wall of the treating chamber opposite to the directive means.

The method and apparatus of the present invention have the following benefits.

A high density region of reaction gas is formed substantially perpendicular to an electron flow propagating into the treating chamber of the apparatus by means of the electron accelerator electrode whereby the electron flow collides against the high density region. As a result, an increased quantity of plasma is produced and throughput speed is increased. The high density region of reaction gas is formed by introducing the reaction gas into the treating chamber through the directive means. The throughput speed is two, three or more times increased by forming a high density region of reaction gas as compared with the absence of such a high density region.

In the embodiment wherein an ion accelerator electrode and/or an ion blocking electrode is provided in the treating chamber, it is possible to selectively extract and feed electrons or ions from the plasma creating chamber toward an article to be treated, resulting in an increased throughput speed and a film of quality while preventing damage to the article and undesirable reaction on the article surface.

In the other embodiment wherein a high vacuum exhaust port is disposed in the wall of the treating chamber opposite to the directive means, the reaction gas introduced into the treating chamber through the directive means is prevented from back scattering at the chamber wall, causing no disturbance to the flow of reaction gas. The high density region is maintained in a stable manner.

In the further embodiment wherein the electron beams coming from the plasma creating chamber are radially spread under the influence of a magnetic field until the electron beam flux has a larger cross section than the plasma creating chamber. This enables plasma treatment over larger surface areas. The radially diverged electron beams are collimated into substantially parallel beams before entering the plasma reaction chamber where the reaction gas is activated with the electron beams. Since a high density region of reaction gas is established substantially perpendicular to the electron beams in the plasma reaction chamber, the density of activated reaction gas is high enough to increase the throughput speed. Where an ion accelerator electrode and/or an ion blocking electrode is additionally provided at the interface between the plasma reaction chamber and the plasma treating chamber, it is possible to selectively extract and feed electrons or ions from the plasma creating chamber toward an article in the plasma treating chamber, resulting in an increased throughput speed and a film of quality while preventing damage to the article and undesirable reaction on the article surface.

In the still further embodiment, the reaction gas in the high density region is activated by the electron beams outgoing from the plasma creating chamber and ion beams are extracted from the activated reaction gas cloud. The ion beams are radially spread under the influence of a magnetic field and then collimated into substantially parallel beams before they enter the plasma treating chamber where an article is treated with collimated ion beams.

BRIEF DESCRIPTION OF THE DRAWINGS

The above and other objects, features, and advantages of the invention will be better understood from the following description taken in conjunction with the accompanying drawings, in which.

DESCRIPTION OF THE PREFERRED EMBODIMENTS

Figure 1:
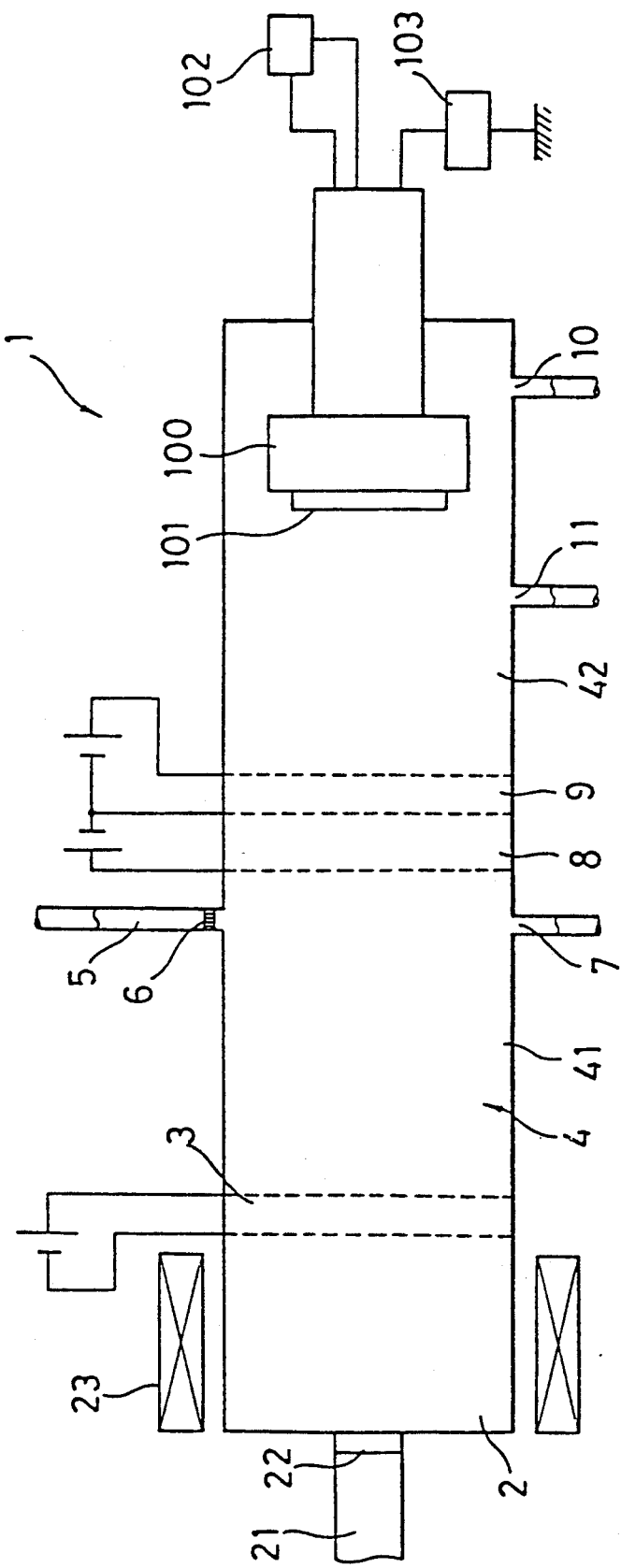
FIG. 1 is a schematic illustration of plasma treating apparatus according to one embodiment of the invention.

Referring to FIG. 1, there is illustrated an apparatus for plasma treatment according to one embodiment of the present invention. The plasma treating apparatus generally designated at 1 includes a plasma creating chamber 2 having means for creating a plasma and a treating chamber 4 in communication with the plasma creating chamber 2 through an electron accelerator electrode 3. Often, both the plasma creating and treating chambers 2 and 4 are juxtaposed and defined in a common housing of elongated cylindrical or rectangular shape. The term longitudinal or axial direction of the housing is the left-to-right direction as viewed in FIG. 1.

A waveguide 21 connected to a microwave power source (not shown) is coupled to the plasma creating chamber 2 through a microwave entrance window 22. A magnet 23 is disposed about the plasma creating chamber 2. These elements constitute the plasma creating means of the electron cyclotron resonance (ECR) type. The magnet 23 may be a permanent magnet or other magnetic field generating means insofar as it can generate a sufficient magnetic field to meet ECR conditions.

The treating chamber 4 includes plasma reaction and treatment sections 41 and 42 in mutual communication through an electron accelerator electrode 8 and an ion blocking electrode 9. The plasma reaction section 41 is provided with an input means in the form of a duct 5 for introducing a reaction gas therein and an exhaust port 7 connected to a high vacuum source. The plasma treatment section 42 is provided with an exhaust port 10 connected to a low vacuum source. A holder 100 for holding an object 101 thereon is disposed in the plasma treatment section 42.

In carrying out plasma treatment in the apparatus 1, the gas in the apparatus is evacuated by means of an oil rotary pump (not shown) through the low vacuum exhaust port 10 until a low vacuum is established therein. Further evacuation is made by means of a turbo type molecular pump (not shown) through the high vacuum exhaust port 7 until a high vacuum of about $10^{-6}$ to $10^{-7}$ Torr is established in the apparatus.

Then, a reaction gas is introduced into the treating chamber 4 through the input duct 5. The reaction gas flows into the plasma creating chamber 2 through diffusion. Microwave is introduced into the plasma creating chamber 2 through the entrance window 22 while the magnet 23 generates a sufficient magnetic field to provide ECR conditions in the plasma creating chamber 2. The microwave electric field cooperates with the magnetic field to accelerate electrons in the plasma creating chamber 2 to collide with reaction gas molecules, thereby creating a plasma.

The electron accelerator electrode 3 serves to selectively draw electrons from the plasma created in the chamber 2 and accelerate them. The electron accelerator electrode 3 includes a pair of opposed electrode plates, with the electrode plate on the treating chamber 4 side being at a higher potential than the other electrode plate on the plasma creating chamber 2 side. Each of the electrode plates may be a conventional electrode plate such as a mesh metal plate.

A power supply to the electron accelerator electrode 3 is preferably of variable voltage type which allows the energy of selectively drawn electrons to be controlled so that a desired plasma may be induced in the treating chamber 4. It will be understood that the reaction gas in the treating chamber 4 need not necessarily be in a plasma state insofar as active species are generated.

The electrons drawn by the electron accelerator electrode 3 enter the treating chamber 4 as a flow of electrons having directivity.

According to the invention, a high density region of reaction gas is formed in the treating chamber 4 substantially perpendicular to the directional electron flow. It is not critical how to form such a high density region. Preferably, means 6 for imparting directivity substantially perpendicular to the directional electron flow to the reaction gas is disposed between the treating chamber 4 and the input duct 5. The reaction gas is confined within a region spanning a plane perpendicular to the longitudinal direction. Then a high density region of reaction gas can be easily formed.

The directive means 6 may comprise a thin plate having a plurality of through holes. In order to impart desired directivity to the reaction gas, the through holes are perforated in the thin plate substantially perpendicular to the directional electron flow travelling past the electron accelerator electrode 3. The directive means 6 serves to impart the desired directivity to the reaction gas on its passage from the input duct 5 to the high vacuum chamber 4 through the holes in the thin plate. Then a high density region is formed in the vacuum chamber 4.

More particularly, gas molecules that have passed the through holes form a beam-shaped flow of molecules in an axial direction of the holes. The configuration of the beam-shaped molecule flow depends on the ratio of length to radius of each through hole, that is, $l/r$ wherein $l$ and $r$ are the length and radius of the hole, respectively.

Figure 2A:
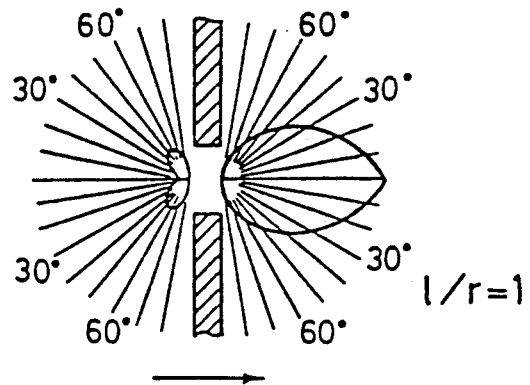
FIGS. 2a, 2b, and 2c illustrate contours of a beam-shaped molecular flow emerging from a through hole in a plate as directivity imparting means used in the apparatus.
Figure 2B:
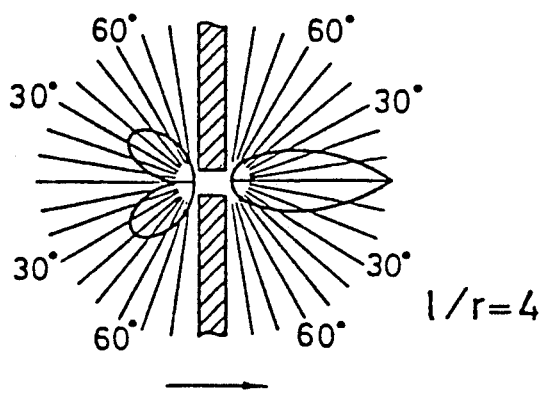
Figure 2C:
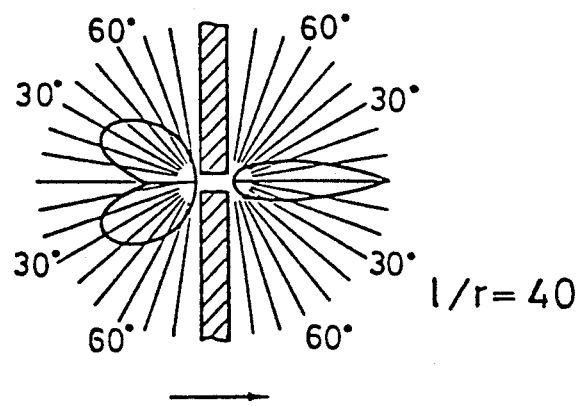

FIGS. 2a, 2b, and 2c show contours having an equiconcentration of gas molecules passing a through hole wherein $l/r$ is 1, 4, and 40. These contours represent the configuration of the beam-shaped molecule flow. In these figures, the left and right sides of the through hole are the low and high vacuum sides, respectively, and gas molecules flow in the direction of an arrow.

The illustrated and other results suggest that the hole's length/radius ration, $l/r$ preferably ranges from 1 to 500, more preferably from 5 to 400. Outside the range, lesser ratios would be difficult to impart directivity to the reaction gas whereas larger ratios would throttle the flow of reaction gas, failing to form a high concentration reaction gas stream in the treating chamber 4.

The diameter (2 r) of through holes preferably ranges from 0.01 to 5,000 μm, more preferably from 0.03 to 500 μm. Outside the range, smaller diameters would throttle the flow of reaction gas, failing to form high concentration reaction gas streams in the treating chamber 4. Larger diameters allow reaction gas molecules to interact, resulting in a scattering reaction gas flow, also failing to set up a reaction gas flow as shown in FIGS. 2a to 2c.

The population of through holes distributed over the plate, which varies with the diameter, is preferably as high as possible, for example, at least $10^2$ holes per square centimeter. Higher the population of holes distributed, the easier is formed a high density region.

The width of the portion of the thin plate where through holes are perforated (the length in the electron flow direction) is not particularly limited although a width of at least 3 mm, especially at least 5 mm is preferred. No particular upper limit is imposed to the width although a maximum width of 50 mm, especially 20 mm is preferred when it is desired to control the active species generated.

In order to increase the quantity of plasma created to increase the throughput speed, the through holes are preferably distributed over the substantially entire plate in a transverse direction of the chamber (perpendicular to the electron flow and facing the viewer in FIG. 1).

Since the thickness of the thin plate is equal to the length l of through holes so that the plate is not fully strong, the thin plate is preferably rested on a mesh-like support.

The material of which the thin plate is formed is not particularly limited and may be selected from various resins such as polycarbonate and polyesters, glasses, and metals. Through holes may be perforated in a resinous thin plate by chemical etching after exposure to energetic particles such as neutrons and in a metal thin plate by etching or other suitable technique. In the case of glass, an assembly of glass tubes may be used, for example. Alternatively, commercially available membrane filters may be used as the directive means. Preferred membrane filters are Nucleapore ® membrane filters manufactured and sold by Nucleapore Co.

If desired, another ion blocking electrode may be disposed between the directive means and the treating chamber to prevent entry of ions to the directive means.

Molecule beams injected from the through holes as the directive means form as a whole a curtain-like molecule flow which constitutes the high density region mentioned above.

The pressure of the high density region should preferably be about $10^{-3}$ to 1 Torr in order to increase the treating rate and to maintain an appropriate pressure in the system other than the high density region. Although it is difficult to actually measure the pressure in the high density region, an increased throughput rate achieved by the present invention suggests that a pressure of such a magnitude prevails in the region.

The pressure in the plasma creating chamber 2 and the treating chamber 4 excluding the high density region is preferably $10^{-5}$ to $10^{-3}$ Torr, especially $10^{-5}$ to $10^{-4}$ Torr. A high electron density is scarcely obtained at lower pressures, whereas at higher pressures, impingement of gas molecules in the high density region with residual gas molecules occurs beyond the negligible level, failing to provide satisfactory ion beams.

The differential pressure between the reaction gas input duct 5 and the treating chamber 4 and the flow rate of reaction gas through the directive means 6 which are necessary to provide the above defined pressure in the high density region of reaction gas may be empirically determined. It will be understood that supply of reaction gas to the input duct 5 is regulated by a mass flow controller (not shown) and that two or more gases may be controlledly mixed to form a reaction gas mixture using two or more mass flow controllers.

The ion drawing and blocking electrodes 8 and 9 include three parallel extending electrode plates, with the central plate shared by the electrodes. The ion accelerator electrode 8 is operated by applying voltage thereacross such that the electrode plate on the plasma reaction section 41 side is at a posi 've potential with respect to the central electrode plate. Then ions of treating gas in the plasma are accelerated across the electrode whereas electrons are decelerated.

The ion blocking electrode 9 is operated by applying voltage thereacross such that the electrode plate on the plasma treating section 42 side is at a positive potential with respect to the central electrode plate. Then ions of treating gas in the plasma are decelerated across the electrode whereas electrons are accelerated.

If both the ion drawing and blocking electrodes 8 and 9 are operated at the same time, both electrons and ions are decelerated and prevented from travelling past the electrodes toward the object 101. Then essentially only neutral species in the plasma travel past the electrodes. If it is desirable to pass only neutral species into the plasma treating section 42, the section 42 is provided with a discharge port 11 for flow regulation. By drawing out the gas through the discharge port 11, a forced flow can be induced in the chamber to increase the flow rate. The discharge port 11 is connected to a high vacuum pump such as a turbo type molecular pump like the high vacuum exhaust port 7.

Which of the electrodes should be installed or operated may be determined depending on an intended plasma treatment.

The power supplies to these electrodes are preferably of variable voltage type. By varying the applied voltage, the energy of drawn ion can be controlled. Low accelerating conditions at voltages of lower than 200 V allow formation of sound films by alleviating damage to the film by energetic ions.

The directive means 6 is preferably located in proximity to the ion drawing and blocking electrodes 8 and 9 because electrons and ions from the reaction gas plasma can efficiently pass across the electrodes, resulting in an increased throughput rate.

The high vacuum exhaust port 7 serves to maintain a predetermined pressure in the apparatus during plasma treatment. In the illustrated embodiment, the high vacuum exhaust port 7 is located on the wall of the treating chamber 4 opposite to the directive means 6. Provision of the exhaust port 7 at this location is effective in preventing those gas molecules of the incoming reaction gas from the directive means 6 which have not been activated or excited into a plasma state from back scattering at the chamber wall, thereby reducing the proportion of under-excited gas molecules reaching the object 101. Then, in the case of plasma CVD, any reactions inhibitory to the intended synthetic reaction can be restrained, ensuring formation of satisfactory films. In the case of plasma etching, anisotropic etching with directional active species at a high rate is possible for the same reason.

The holder 100 is connected to heating means 102 and a bias power supply 103 outside the housing. The heating means 102 is provided since it is often necessary to heat the object 101 during plasma CVD. The bias power supply 103 is to apply bias voltage across the object 101. The bias voltage may be either AC or DC voltage as the case may be.

The holder 100 is mounted in the housing for back and forth movement such that it can position the object 101 within the mean free path of molecules depending on the intended treating conditions.

The treating chamber 4 may have any desired shape, preferably an elongated cylindrical or rectangular shape. The dimensions of treating chamber 4 are not critical. Typically, the distance between the electron accelerator electrode 3 and the ion accelerator electrode 8 is about 30 to 200 mm, and the distance between the ion blocking electrode 9 and the object 101 is about 100 to 500 mm.

Although the plasma creating and treating chambers 2 and 4 have the same inner diameter in the embodiment shown in FIG. 1, the inner diameter of the treating chamber 4 may be set larger than that of the plasma creating chamber 2. In the modified embodiment, an electron flow having a larger cross section can be formed by moving the electron accelerator electrode 3 to the right from the position shown in FIG. 1. The invention is then applicable to an object having a larger surface area. Further, a magnet may be provided about the periphery of the treating chamber 4 between the plasma creating chamber and the electron accelerator electrode such that electrons are spread toward the chamber wall. These embodiments will be described later in conjunction with FIGS. 3 to 5.

The type of the plasma creating means used herein is not critical. If desired, the above-mentioned plasma creating means of ECR type may be replaced by any other suitable plasma creating means, for example, a means for conducting microwave parallel to a magnetic field to provide a high electron density. Among others, plasma creating means of ECR type and field parallel microwave conduction are advantageous because a high electron density is established.

Figure 3:
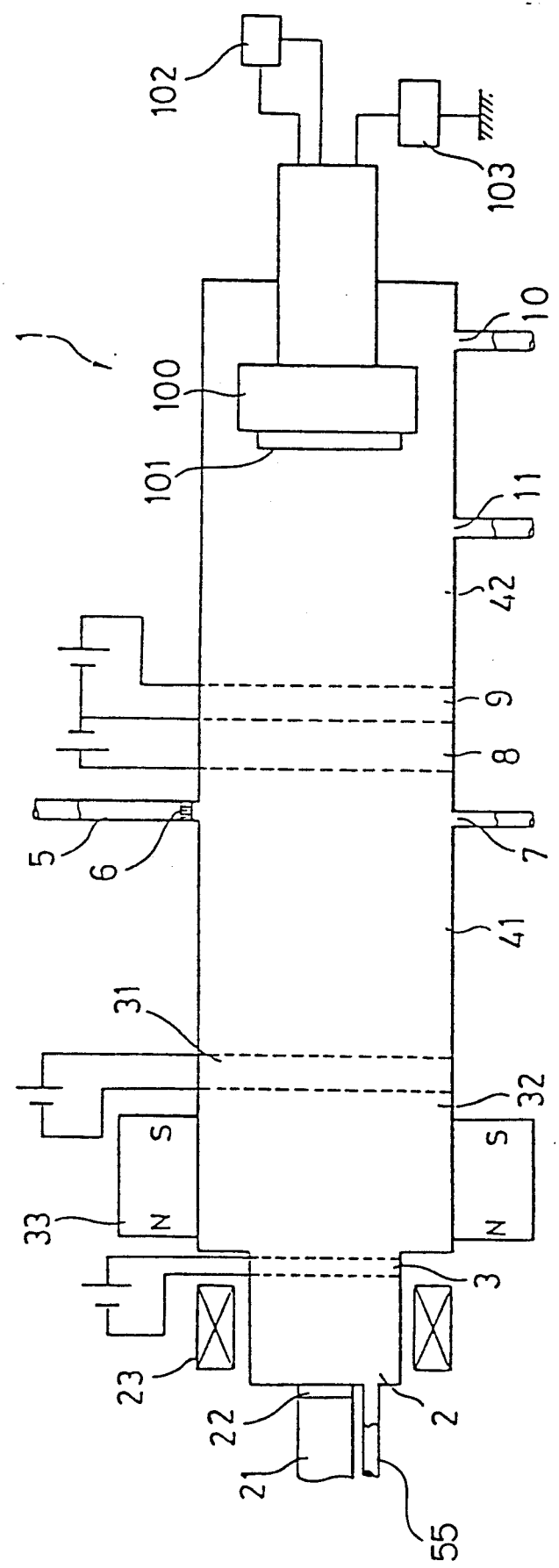
FIGS. 3 and 5 are schematic illustrations of plasma treating apparatus according to another embodiment of the invention, with FIG. 5 being a modification of FIG. 3.
Figure 5:
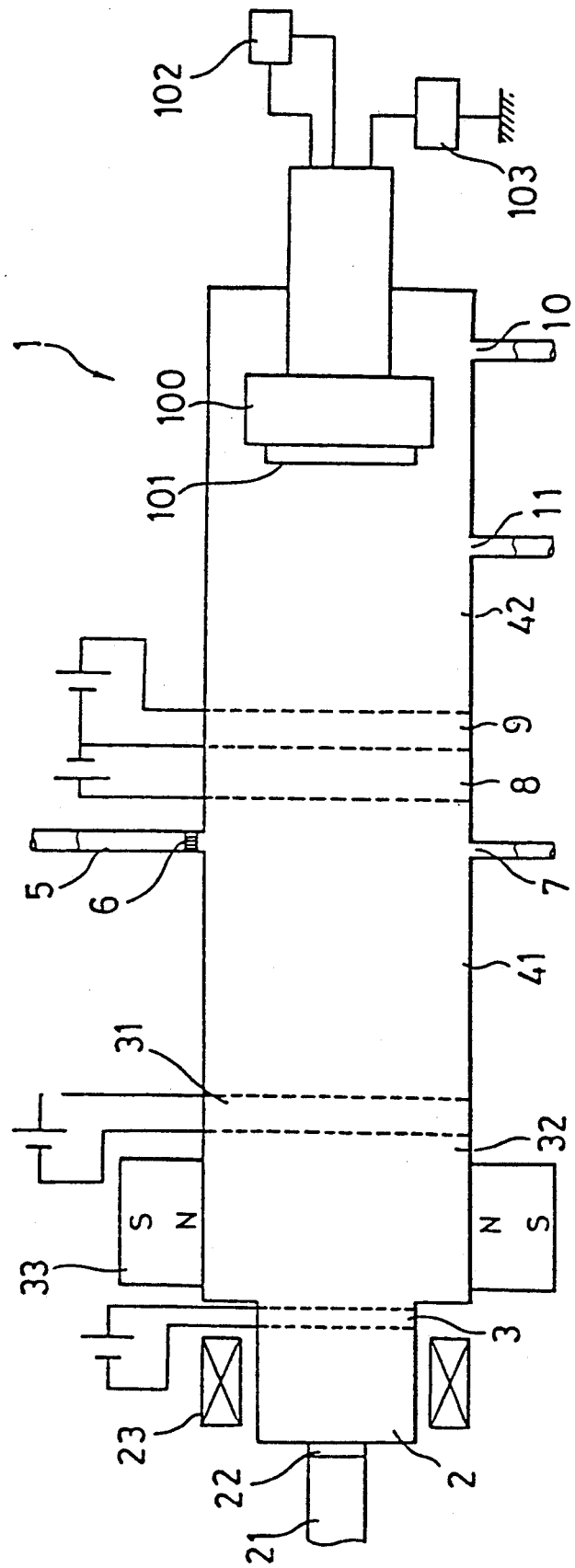

FIG. 3 illustrates a plasma treating apparatus according to another embodiment of the invention while a modified version thereof is shown in FIG. 5. The plasma treating apparatus generally designated at 1 includes a plasma creating chamber 2, an electron accelerator electrode 3 for drawing electron beams from the chamber 2, a diverging chamber 32 for radially diverging the electron beams, a collimating electrode 31 for collimating the electron beams, a plasma reaction chamber 41, and a plasma treating chamber 42, the chambers being arranged in series. An inlet duct 5 is connected to the plasma reaction chamber 41 for introducing reaction gas therein. A magnet 33 is disposed about the periphery of the diverging chamber 32 for radially diverging the electron beams. Since several of the components have approximately the same construction and function as in the FIG. 1 embodiment, their description is omitted for brevity's sake.

In carrying out plasma treatment in the apparatus 1 of FIG. 3, after a high vacuum is established as previously described in the FIG. 1 embodiment, a reaction gas is introduced into the plasma reaction chamber 41 through the inlet duct 5. The reaction gas flows into the plasma creating chamber 2 through diffusion.

Microwave is introduced into the plasma creating chamber 2 through the entrance window 22 while the magnet 23 generates a sufficient magnetic field to provide ECR conditions in the plasma creating chamber 2. The microwave electric field cooperates with the magnetic field to accelerate electrons in the plasma creating chamber 2 to collide with reaction gas molecules, thereby creating a plasma.

The electron accelerator electrode 3 serves to selectively draw electrons from the plasma created in the chamber 2. The thus led-out electron beams are approximately parallel electron beams propagating to the right in the figure and the electron beam flux as a whole has approximately the same cross sectional area as the plasma creating chamber 2.

The magnetic field produced by the magnet 33 serves to radially spread the electron beams to increase the cross sectional area of the beam flux. In the diverging chamber 32, the magnet 33 produces a magnetic field whose intensity gradually lowers toward the collimating electrode 31. The magnetic field applies a force to the electron beams in a direction toward the wall of the chamber so that the diameter of the electron beam flux increases. The term radial is used with respect to a longitudinal axis of the chamber-defining housing. The magnet 33 may be any desired one which can apply such a force to the electron beams. Preferably an annular magnet is mounted such that its N pole is located on the electron accelerator electrode 3 side and its S pole is located on the collimating electrode 31 side as shown in FIG. 3. Further preferably, an auxiliary magnet (not shown) is mounted adjacent the N pole side of the annular magnet 33. The auxiliary magnet is also an annular magnet having a smaller inner diameter than the annular magnet 33 with N and S poles positioned along the inner and outer circumferences thereof. The auxiliary magnet cooperates with the primary magnet 33 to produce a magnetic field whose intensity gradually lowers toward the collimating electrode 31 over a wider range in the diverging chamber 32, promoting radial divergence of the electron beams. Instead of the axially polarized magnet 33, an annular magnet having N and S poles positioned along its inner and outer circumferences as shown in FIG. 5 may be used.

It will be understood that the construction of magnet 33 is not particularly limited as long as it can produce an effective magnetic field in the diverging chamber 32. A plurality of concentrically arranged magnets or an array of magnet segments may be used. A permanent magnet of simple configuration is preferred.

The electron accelerator electrode 3 serves to selectively extract electrons from the plasma created in the chamber 2 and the collimating electrode 31 serves to accelerate the electron beams which have been dispersed by the magnet 33. The electron beams that have passed across the collimating electrode 31 have an increased velocity component in the longitudinal direction and become substantially parallel. Each of the electron accelerator and collimator electrodes 3 and 31 includes a pair of opposed electrode plates, with the electrode plate on the plasma reaction chamber 41 side being at a higher potential with respect to the other electrode plate on the plasma creating chamber 2 side. Each of these and other electrode plates may be a conventional electrode plate such as a mesh metal plate.

The percent radial divergence of the electron beam flux is preferably 150% or more although it depends on the voltage applied across the electron accelerator electrode 3, the length and magnetic force of the magnet 33, and the length of the diverging chamber 32. The parallelism and energy of the electron beams that have passed the collimating electrode 31 depend on the voltage applied across the collimating electrode 31. In order to provide electron beams having a desired cross sectional area and energy, variable voltage power supplies are preferably connected to these electrodes.

The directional electron beams past the collimating electrode 31 enter the plasma reaction chamber 41. According to the invention, a high density region of the reaction gas has been formed in the plasma reaction chamber 41 substantially perpendicular to the electron beams. The electron beams activate or excite the reaction gas in the high density region to generate active species in a high density. Also in the FIG. 3 embodiment, the reaction gas need not be excited into a plasma state in the plasma reaction chamber 41 insofar as at least active species are generated.

The electron beam diverging chamber 32, plasma reaction chamber 41, and plasma treating chamber 42 may have any desired shape, but preferably an elongated cylindrical or rectangular shape. The dimensions of the chambers are not critical. Typically, the distance between the electron accelerator electrode 3 and the collimating electrode 31 is about 20 to 150 mm, the distance between the collimating electrode 31 and the ion accelerator electrode 8 is about 30 to 200 mm, and the distance between the ion blocking electrode 9 and the object 101 is about 100 to 500 mm.

Figure 4:
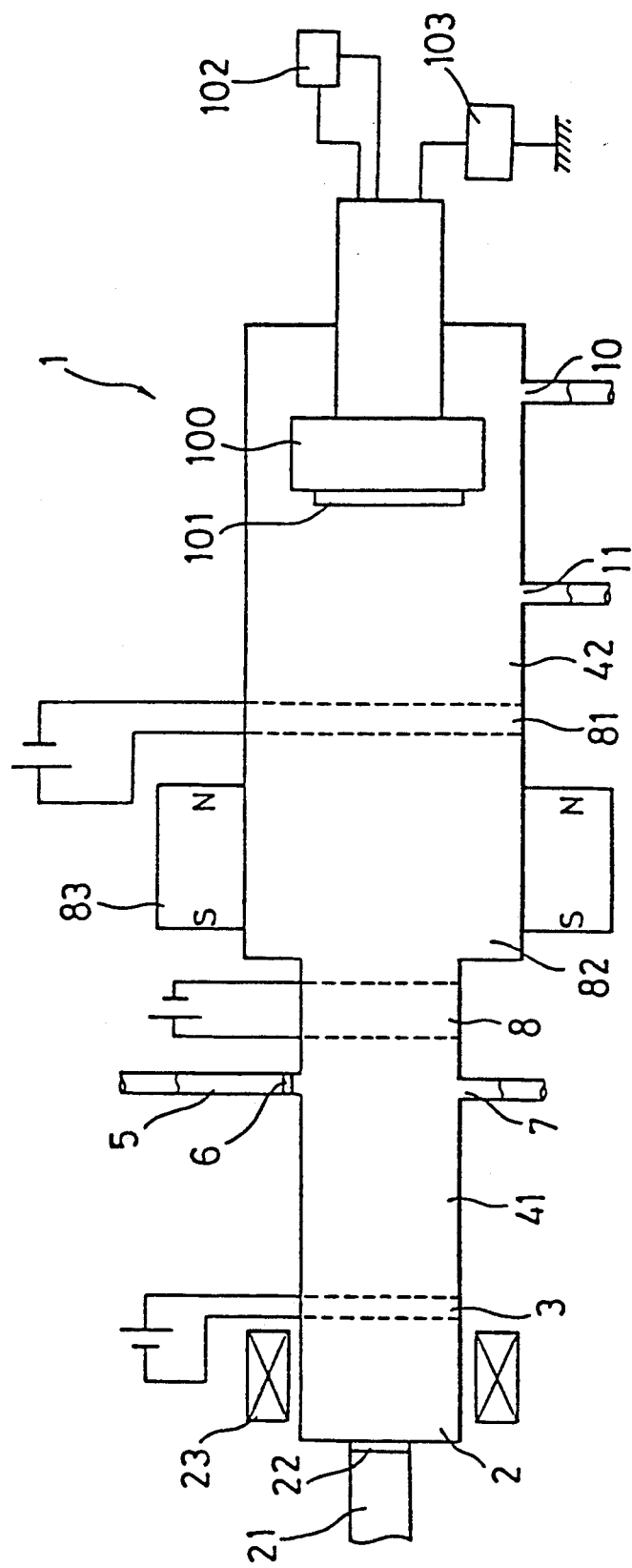
FIG. 4 is a schematic illustration of plasma treating apparatus according to a further embodiment of the invention.

FIG. 4 illustrates a plasma treating apparatus according to a further embodiment of the invention. The plasma treating apparatus generally designated at 1 includes a plasma creating chamber 2, an electron accelerator electrode 3 for drawing electron beams from the chamber 2, a plasma reaction chamber 41, an ion accelerator electrode 8 for drawing ion beams from the reaction chamber 41, a diverging chamber 82 for radially diverging the ion beams, a collimating electrode 81 for collimating the ion beams, and a plasma treating chamber 42, the chambers being arranged in series. An inlet duct 5 is connected to the plasma reaction chamber 41 for introducing reaction gas therein.

The plasma creating chamber 2, plasma reaction chamber 41, and plasma treating chamber 42 have approximately the same construction and function as in the embodiments of FIGS. 1 and 3. In this embodiment, the diverging chamber 82 is located downstream of the ion accelerator electrode 8. A magnet 83 is disposed about the periphery of the diverging chamber 82 for radially diverging the ion beams.

A high density plasma is generated in the plasma reaction chamber 41 as in the FIG. 1 embodiment. Ion beams are extracted from the plasma by means of the ion accelerator electrode 8. The led-out ion beams are substantially parallel beams propagating to the right in the figure and the ion beam flux has approximately the same cross sectional area as the plasma creating chamber 2.

The magnetic field produced by the magnet 83 serves to radially spread the ion beams to increase the cross sectional area of the beam flux. In the diverging chamber 82, the magnet 83 produces a magnetic field whose intensity gradually lowers toward the collimating electrode 81. The magnetic field applies a force to the ion beams toward the wall of the chamber so that the diameter of the ion beam flux increases. The magnet 83 may be of any desired construction which can apply such a force to the electron beams as is the magnet 33 of the FIG. 3 embodiment. When it is desired to diverge cations, an annular magnet is preferably mounted such that its S pole is located on the ion accelerator electrode 8 side and its N pole is located on the collimating electrode 81 side as shown in FIG. 4. Also preferred is an annular magnet with S and N poles positioned along the inner and outer circumferences thereof, respectively. In the case of anions, the polarity of magnet is reversed. The polarity of the ion accelerator electrode 8 and collimating electrode 81 is reversed from that for cation divergence.

The ion accelerator electrode 8 serves to selectively extract ions from the plasma in the chamber 41 and the collimating electrode 81 serves to accelerate the ion beams which have been diverged by ..e magnet 83. The ion beams that have passed the collimating electrode 81 have an increased velocity component in the longitudinal direction and become substantially parallel. In the plasma treating chamber 42, the object 101 is treated with the ion beams. Each of the ion accelerator and collimator electrodes 8 and 81 includes a pair of opposed electrode plates, with the electrode plate on the plasma reaction chamber 41 side being at a higher potential with respect to the other electrode plate on the plasma treating chamber 42 side.

The percent radial divergence of the ion beam flux is preferably 150% or more although it depends on the voltage applied across the ion accelerator electrode 8, the length and magnetic force of the magnet 83, and the length of the diverging chamber 82. The parallelism and energy of the ion beams that have passed the collimating electrode 81 depend on on the voltage applied across the collimating electrode 81. In order to provide ion beams having a desired cross sectional area and energy, variable voltage power supplies are preferably connected to these electrodes.

It will be understood that the construction of magnet 83 mounted around the diverging chamber 82 is not particularly limited as long as it can produce an effective magnetic field in the diverging chamber 82. A permanent magnet of simple configuration is preferred.

The dimensions of respective components of the plasma treating apparatus are not critical and any desired dimensions may be chosen so as to meet requirements of the intended application such as treating surface area. Typically, the distance between the electron accelerator electrode 3 and the ion accelerator electrode 8 is about 30 to 200 mm, the distance between the ion accelerator electrode 8 and the collimating electrode 81 is about 20 to 300 mm, and the distance between the collimating electrode and the object 101 is about 100 to 500 mm.

The plasma treating apparatus of the invention is especially adapted for plasma CVD and plasma etching. The invention is applicable to any types of plasma CVD including formation of films of amorphous silicon, SiC, carbon, $SiN_x$ and $SiO_x$; polycrystalline silicon, SiC, and diamond; and monocrystalline silicon, SiC, and diamond. For film formation, other parameters such as substrate temperature may be determined for a particular purpose without undue experimentation. Reaction gases used in plasma CVD may also be selected according to a particular film to be deposited. Ordinary reactive gases such as silane gas for amorphous silicon films and hydrocarbon gas for diamond films are useful.

Also, the invention is applicable to any types of plasma etching. Reactive gases used in plasma etching are not particularly limited. For example, halogen gases such as chlorine gas and halide gases such as chloride and fluoride gases are useful. If desired, hydrogen or an inert gas may be used in addition to the reactive gas.

In a further preferred embodiment, the plasma creating chamber 2 is provided with a supplemental port 55 for introducing a gas as shown in FIG. 3. The gas introduced through the supplemental port is either a reactive gas or a non-reactive gas.

In the previous embodiments wherein the reaction gas is introduced into the apparatus only through input means 5 and directive means 6, a high density region of reaction gas is formed in plasma reaction chamber 41 as previously described while the pressure in the system other than plasma reaction chamber 41, that is, plasma treating chamber 42 and plasma creating chamber 2 is maintained by diffusion of reaction gas from the high density region. Therefore, entry of reaction gas through directive means 6 should be controlled such that the reaction gas in plasma creating chamber 2 may be at a pressure for plasma creation. If the reaction gas is additionally introduced into plasma creating chamber 2 through the gas feed port 55, supply of the reaction gas through input means 5 and directive means 6 becomes independent of pressure maintenance in plasma creating chamber 2 so that a high density region may be formed more easily.

Further, the previous embodiments wherein the reaction gas is introduced into the apparatus only through input means 5 and directive means 6 require frequent cleaning, because the reaction gas in plasma creating chamber 2 is excited into a plasma so that deposition occurs on microwave inlet window 22 and electron accelerator electrode 3. If the reaction gas is introduced into the apparatus only through input means 5 and directive means 6 and a gas other than the reaction gas, for example, hydrogen gas or other inert gas is introduced into plasma creating chamber 2 through the supplemental feed port 55, then the partial pressure of reaction gas in plasma creating chamber 2 is lowered to reduce deposition on microwave inlet window 22 and electron accelerator electrode 3. No lowering of throughput speed occurs since the pressure of reaction gas in the high density region remains unchanged.

It should be appreciated that the present invention is also applicable to ion implantation.

EXAMPLE

Examples of the present invention are given below by way of illustration and not by way of limitation. In the examples, SCCM is standard cubic centimeter.

EXAMPLE 1

Using the plasma treating apparatus 1 shown in FIG. 1, a thin film of diamond was formed by plasma CVD. The electron accelerator electrode 3 was spaced 70 mm from ion accelerator electrode 8, and an object or substrate 101 was spaced 150 mm from ion blocking electrode 9. The directive means 6 was a polycarbonate thin plate having on a mesh support. Through holes were distributed in a population of $2 \times 10^7$ per square centimeter in the area of the thin plate dimensioned 10 mm in the longitudinal direction (electron flow direction) by 120 mm in the transverse direction. Each through hole had a length (l) of 11 $\mu$m and a radius (r) of 1 $\mu$m, with $l/r = 11$.

The gas in the plasma treating apparatus was evacuated to a low vacuum through low vacuum exhaust port 10 and then to a high vacuum through high vacuum exhaust port 7 until a high vacuum of $10^{-6}$ Torr was established in the housing interior.

A reaction gas was introduced into treating chamber 4 through input means 5 and directive means 6. A mixture of $CH_4$ and $H_2$ in a volume ratio of 1:100 was passed as the reaction gas at a flow rate of 150 SCCM. While supplying the reaction gas, evacuation through the high vacuum exhaust port 7 was continued such that plasma creating chamber 2 and plasma treating chamber 42 were maintained at a pressure of $4 \times 10^{-4}$ Torr.

Plasma CVD was conducted by creating an ECR plasma in plasma creating chamber 2 and applying voltage to electron accelerator electrode 3 and ion accelerator electrode 8. The plasma creating conditions included a microwave operating power of 300 Watts, a magnet current flow of 5 amperes, a pressure of $4 \times 10^{-4}$ Torr, and an accelerator voltage of $-800$ volts (nagative to the substrate). The substrate used was a silicon wafer which was heated at 900° C. The bias voltage supply 103 applied AC bias across the substrate in order to prevent charge accumulation on its surface.

There was deposited a film of 1 $\mu$m thick on the silicon wafer substrate. The film was identified to be diamond by X-ray diffraction analysis and Raman spectroscopy. Little idiomorphic face was observed under a scanning electron microscope.

For comparison purposes, plasma CVD was conducted with directive means 6 omitted from input means 5. The pressure in treating chamber 42 and plasma creating chamber 2 was the same as above. For both the operations with and without the directive means, the ion concentration in proximity to ion accelerator electrode 8 was measured by emission spectroscopy. The ion concentration during the operation with the directive means was 80 times that without the directive means. The rate of deposition was increased three times over that without the directive means.

EXAMPLE 2

Using the same apparatus as in Example 1, an amorphous silicon film was formed by plasma CVD. The conditions were the same as in Example 1 except that a mixture of $SiH_4$ and $H_2$ in a volume ratio of 1:50 was passed as the reaction gas at a flow rate of 150 SCCM and the substrate was heated to 200° C.

The film was identified to be amorphous silicon by X-ray diffraction analysis and Raman spectroscopy.

For both the operations with and without the directive means, the ion concentration in proximity to ion accelerator electrode 8 was measured to find at least equivalent results to those of Example 1. The rate of deposition was also increased at least equally to Example 1.

EXAMPLE 3

Using the same apparatus as in Example 1, plasma etching was conducted. The reaction gas used was $SF_6$. While supplying the reaction gas, evacuation through the high vacuum exhaust port 7 was continued such that plasma creating chamber 2 and plasma treating chamber 42 were maintained at a pressure of $4 \times 10^{-4}$ Torr. The object to be treated was a 1 $\mu$m thick amorphous silicon film on a quartz support having formed thereon a resist pattern with a line width of 1 $\mu$m.

At the end of etching, grooves of a well defined cross section without lateral etching were found.

For both the operations with and without the directive means, the ion concentration in proximity to ion accelerator electrode 8 was measured to find at least equivalent results to those of Example 1. The rate of etching was increased six times over that without the directive means.

EXAMPLE 4

Using the plasma treating apparatus shown in FIG. 3, a thin film of diamond was formed by plasma CVD. The plasma creating chamber 2 had a diameter of 100 mm and diverging chamber 32 had a diameter of 170 mm. The distance between electron accelerator electrode 3 and collimating electrode 31 was 70 mm, the distance between collimating electrode 31 and ion accelerator electrode 8 was 70 mm, and the distance between ion blocking electrode 9 and a substrate or object 101 was 150 mm. The magnet 33 for diverging electron beams was an annular permanent magnet having an axial length of 40 mm. The directive means 6 was a perforated polycarbonate thin plate on a mesh support which was the same as used in Example 1.

The gas in the plasma treating apparatus was evacuated to a low vacuum through low vacuum exhaust port 10 and then to a high vacuum through high vacuum exhaust port 7 until a high vacuum of $10^{-6}$ Torr was established in the housing interior.

A reaction gas was introduced into plasma reaction chamber 41 through input means 5 and directive means 6. A mixture of $CH_4$ and $H_2$ in a volume ratio of 1:100 was passed as the reaction gas at a flow rate of 150 SCCM. While supplying the reaction gas, evacuation through the high vacuum exhaust port 7 was continued such that plasma creating chamber 2 and plasma treating chamber 42 were maintained at a pressure of $4 \times 10^{-4}$ Torr.

Plasma CVD was conducted by creating an ECR plasma in plasma creating chamber 2 and applying voltage to electron accelerator electrode 3, electron beam collimating electrode 31, and ion accelerator electrode 8. The substrate used was a 6-inch diameter silicon wafer which was heated at 900° C. The bias voltage supply 103 applied AC bias across the substrate in order to prevent charge accumulation on its surface.

There was deposited a film of 1 μm thick on the silicon wafer substrate. The film was identified to be diamond by X-ray diffraction analysis and Raman spectroscopy. Little idiomorphic face was observed under a scanning electron microscope, indicating that the film was formed evenly over the entire substrate surface without irregularities.

EXAMPLE 5

Using the same apparatus as in Example 4, an amorphous silicon film was formed by plasma CVD. The conditions were the same as in Example 4 except that a mixture of $SiH_4$ and $H_2$ in a volume ratio of 1:50 was passed as the reaction gas at a flow rate of 150 SCCM and the substrate was heated to 200° C.

The film was identified to be amorphous silicon by X-ray diffraction analysis and Raman spectroscopy. An observation under a scanning electron microscope indicated that the film was formed evenly over the entire substrate surface without irregularities.

EXAMPLE 6

Using the same apparatus as in Example 4, plasma etching was conducted. The reaction gas used was $SF_6$. While supplying the reaction gas, evacuation through the high vacuum exhaust port 7 was continued such that plasma creating chamber 2 and plasma treating chamber 42 were maintained at a pressure of $4 \times 10^{-4}$ Torr. The object to be treated was a 1-μm thick, 6-inch diameter amorphous silicon film on a quartz support having formed thereon a resist pattern with a line width of 1 μm.

At the end of etching, grooves of a well defined cross section without lateral etching were found. An observation under a scanning electron microscope indicated that etching occurred evenly over the exposed film surface portions without irregularities.

Also in Examples 4 to 6, increases in ion concentration and depositing or etching rate over the operation without directive means were found as in Examples 1 to 3.

EXAMPLE 7

Using the plasma treating apparatus shown in FIG. 4, plasma treatment was conducted as in Examples 4 to 6.

The plasma creating chamber 2, plasma reaction chamber 41, and plasma treating chamber 42 had the same dimensions in Example 4. The ion beam diverging chamber 82 had the same diameter as the electron beam diverging chamber 32 in Example 4. The distance between ion accelerator electrode 8 and collimating electrode 81 was 150 mm. The directive means 6 and other components were substantially the same as in Example 4.

Even plasma treatments were consistently achieved in all the runs.

The present invention implements a plasma treating apparatus characterized by fast treatment. Articles are plasma treated with minimized damage thereto. In particular, plasma CVD forms substantially defect-free films of high quality. The invention also allows plasma treatment over a larger surface area.

Although some preferred embodiments have been described, many modifications and variations may be made thereto in the light of the above teachings. It is therefore to be understood that within the scope of the appended claims, the invention may be practiced otherwise than as specifically described.

I claim:

1. A method for conducting plasma treatment using a plasma treating apparatus, comprising the steps of:
   creating a plasma in a plasma creating chamber having means for creating a plasma therein, said plasma creating chamber being in communication with a treating chamber via an electron accelerator electrode,
   drawing a flow of electrons from the plasma into said treating chamber with the electron accelerator electrode,
   introducing a reaction gas into said treating chamber through directive means comprising a thin plate having a plurality of through holes formed therein, thereby forming a high density region of the reaction gas having an apex at the plurality of through holes and that extends in a layer substantially perpendicular to said electron flow in said treating chamber, whereby the reaction gas is activated by collision with electrons of said electron flow to form a high density plasma region; and
   conducting plasma treatment on an object in the treating chamber.

2. The method of claim 1 wherein said plasma creating means is of the electron cyclotron resonance type.

3. The method of claim 1 or 2 wherein the plasma treatment is plasma chemical vapor deposition.

4. The method of claim 1 or 2 wherein the plasma treatment is plasma etching.

5. The method of claim 1, wherein the object is disposed in the treating chamber opposite to said electron flow with respect to the high density plasma region.

6. The method of claim 1, wherein the through holes extend through the thin plate in a direction substantially perpendicular to said electron flow and are of cylindrical shape having a length l and a radius r in a ratio l/r of from 1/1 to 500/1.

7. The method of claim 1, which further comprises the step of conveying selected species from the high density plasma region toward the object by means of an ion accelerator electrode and/or an ion blocking electrode in said treating chamber.

8. A method for conducting plasma treatment using a plasma treating apparatus, comprising the steps of:
   creating a plasma in a plasma creating chamber having means for creating a plasma therein, aid plasma creating chamber being in communication with a diverging chamber via an electron accelerator electrode,
   drawing electron beams from the plasma using the electron accelerator electrode,
   radially diverging the electron beams using the diverging chamber, said diverging chamber having a magnet disposed about its periphery and being in communication with a plasma reaction chamber via a collimating electrode,
   collimating the divergent electron beams into substantially parallel electron beams directed into the reaction chamber, with the collimating electrode, introducing a reaction gas in aid reaction chamber through directive means comprising a thin plate having a plurality of through holes formed therein, thereby forming a high density region of the reaction gas having an apex at the plurality of through holes and that extends in a layer substantially perpendicular to the electron beams in said plasma reaction chamber, whereby the reaction gas is activated by collision with electrons of said electron beams to form a high density plasma region, a treating chamber being coupled to said reaction chamber; and conducting plasma treatment on an object in the treating chamber.

9. The method of claim 8 wherein said plasma creating means is of the electron cyclotron resonance type.

10. The method of claim 8 or 9 wherein the plasma treatment is plasma chemical vapor deposition.

11. The method of claim 8 or 9 wherein the plasma treatment is plasma etching.

12. The method of claim 8, wherein the object is disposed in the treating chamber opposite to said electron flow with respect to the high density plasma region.

13. The method of claim 8, wherein the through holes extend through the thin plate in a direction substantially perpendicular to said electron flow and are of cylindrical shape having a length l and a radius r in a ration l/r of from 1/1 to 500/1.

14. The method of claim 8, which further comprises the step of conveying selected species from the high density plasma region toward the object by means of an ion accelerator electrode and/or an ion blocking electrode in said treating chamber.

15. A method for conducting plasma treatment using a plasma treating apparatus, comprising the steps of:

creating a plasma in a plasma creating chamber having means for creating a plasma therein, said plasma creating chamber being coupled to a plasma reaction chamber via an electron accelerator electrode, drawing electron beams from the plasma, with the electron accelerator electrode, into the plasma reaction chamber, introducing a reaction gas in said plasma reaction chamber through directive means comprising a thin plate having a plurality of through holes formed therein, thereby forming a high density region of the reaction gas having an apex at the plurality of through holes and that extends in a layer substantially perpendicular to the electron beams in said plasma reaction chamber, the reaction gas being activated by collisions with electrons of the electron beams in said plasma reaction chamber, a radial diverging chamber with a magnet disposed about is periphery being coupled to said reaction chamber via an ion accelerator electrode, drawing ion beams from the plasma reaction chamber to the radial diverging chamber using the ion accelerator electrode, radially diverging the ion beams travelling past the ion accelerator electrode in the diverging chamber, collimating the divergent ion beams into substantially parallel ion beams using a collimating electrode, the diverging chamber being coupled to a treating chamber via the collimating electrode, and conducting plasma treatment on an object with the collimated ion beams in the treating chamber.

16. The method of claim 15 wherein said plasma creating means is of the electron cyclotron resonance type.

17. The method of claim 156 or 16 wherein the plasma treatment is plasma chemical vapor deposition.

18. The method of claim 15 or 16 wherein the plasma treatment is plasma etching.

19. The method of claim 15, wherein the object is disposed in the treating chamber opposite to said electron flow with respect to the high density plasma region.

20. The method of claim 15, wherein the through holes extend through the thin plate in a direction substantially perpendicular to said electron flow and are of cylindrical shape having a length l and a radius r in a ration l/r of from 1/1 to 500/1.

21. The method of claim 15, which further comprises the step of conveying selected species from the high density plasma region toward the object by means of an ion accelerator electrode and/or an ion blocking electrode in said treating chamber.

* * * * *

UNITED STATES PATENT AND TRADEMARK OFFICE
CERTIFICATE OF CORRECTION

PATENT NO. : 5,082,685

DATED : January 21, 1992

INVENTOR(S) : Hisao Morooka

It is certified that error appears in the above-identified patent and that said Letters Patent is hereby corrected as shown below:

Column 16, (claim 8) line 55, change "aid" to --said--.

Column 17, (claim 8) line 1, change "aid" to --said--.

Column 18, (claim 17) line 28, change "156" to --15--.

Column 18, (claim 20) line 40, change "ration" to --ratio--.

Signed and Sealed this

Twenty-second Day of June, 1993

Attest:

MICHAEL K. KIRK

Attesting Officer

Acting Commissioner of Patents and Trademarks